US012670954B2

(12) United States Patent
Chinthu et al.

(10) Patent No.:  US 12,670,954 B2
(45) Date of Patent:      Jun. 30, 2026

(54) RESISTIVE RANDOM ACCESS MEMORY (RRAM) ARCHITECTURE AND METHOD

(71) Applicant: GlobalFoundries U.S. Inc., Malta, NY (US)

(72) Inventors: Siva Kumar Chinthu, Bangalore (IN); Venkatesh Periyapatna Gopinath, Fremont, CA (US); Suresh Pasupula, Bangalore (IN); Navneet K. Jain, Milpitas, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 100 days.

(21) Appl. No.: 18/734,421

(22) Filed: Jun. 5, 2024

(65) Prior Publication Data

US 2025/0378877 A1      Dec. 11, 2025

(51) Int. Cl.
*G06F 3/06*          (2006.01)
*G11C 13/00*        (2006.01)

(52) U.S. Cl.
CPC .......... *G11C 13/004* (2013.01); *G06F 3/0604* (2013.01); *G06F 3/0655* (2013.01); *G06F 3/0673* (2013.01); *G11C 13/0026* (2013.01); *G11C 13/0028* (2013.01); *G11C 13/0069* (2013.01); *G11C 13/0097* (2013.01); *G11C 2213/79* (2013.01)

(58) Field of Classification Search
CPC .............. G11C 13/004; G11C 13/0026; G11C 13/0028; G11C 13/0069; G11C 13/0097; G11C 2213/79; G06F 3/0604; G06F 3/0655; G06F 3/0673

USPC ......................................................... 365/148
See application file for complete search history.

(56) References Cited

U.S. PATENT DOCUMENTS 5,077,691 A    12/1991   Haddad et al.
7,903,448 B2    3/2011   Oh et al.
(Continued)

OTHER PUBLICATIONS

Huynh et al., "Assessment of a Thick-Oxide Transistor from the 22FDX Platform for 5G NR sub-6 GHZ FEMs," Conference Paper, Sep. 2019, downloaded from https://www.researchgate.net/publication/336210239 on Apr. 16, 2024, 5 pages.
(Continued)

*Primary Examiner* — Ly D Pham
(74) *Attorney, Agent, or Firm* — David Cain; Hoffman Warnick LLC

(57) ABSTRACT

Disclosed are a resistive random access memory (RRAM) structure and operating method. The RRAM structure includes RRAM cells arranged in columns and rows with all cells in a column connected between source and bit lines for the column and with all cells in a row connected to a word line for the row. The RRAM structure also includes peripheral circuitry enabling all memory operations to be performed without selective source line biasing. For example, during a reset operation, the following voltage conditions can be applied: a low positive voltage (e.g., of +1.8V) to the word line of the row containing the selected RRAM cell; a low negative voltage (e.g., of −1.8V) to all other word lines; and another low negative voltage (e.g., of −1.6V) to the bit line of the column containing the selected RRAM cell. All source lines and all other bit lines can be discharged to ground.

18 Claims, 7 Drawing Sheets

(56) References Cited

U.S. PATENT DOCUMENTS

| | | | | |
|---|---|---|---|---|
| 9,881,676 | B1 * | 1/2018 | Yuh | G11C 16/12 |
| 10,643,713 | B1 * | 5/2020 | Louie | G11C 16/26 |
| 12,283,315 | B2 * | 4/2025 | Terada | G11C 13/004 |
| 2011/0032746 | A1 * | 2/2011 | Maejima | G11C 13/003 |
| | | | | 365/189.06 |
| 2014/0185362 | A1 | 7/2014 | Haukness | |
| 2018/0068736 | A1 * | 3/2018 | Kim | G11C 29/028 |
| 2019/0392894 | A1 * | 12/2019 | Zhao | G11C 16/28 |
| 2023/0207005 | A1 | 6/2023 | Lin et al. | |
| 2023/0326499 | A1 * | 10/2023 | Pasotti | G11C 13/004 |
| | | | | 365/191 |
| 2023/0326524 | A1 * | 10/2023 | Pasotti | G11C 7/1006 |
| | | | | 365/163 |

OTHER PUBLICATIONS

Aziza et al., "Multi-Level Control of Resistive RAM (RRAM) Using a Write Termination to Achieve 4 Bits/Cell in High Resistance State," Electronics 2021, 10, 2222, published Sep. 10, 2021, 15 pages.

Kumar et al., "Metal oxide resistive switching memory: Materials: properties and switching mechanisms," Ceramics International 43 (2017), S547-S556.

* cited by examiner

| OPERATION/NODE | FORMING | SET | RESET | READ |
|---|---|---|---|---|
| ALL SLs | 0.0V | 0.0V | 0.0V | 0.0V |
| WL for row including selected RRAM | +2.5V | +2.5V | +1.8V | +1.8V |
| WLs for all other rows | 0.0V | 0.0V | -1.8V | 0.0V |
| BL for column including selected RRAM | +4.0V | +2.5V | -1.6V | +150mV |
| BLs for all other columns | 0.0V | 0.0V | 0.0V | 0.0V |

FIG. 3

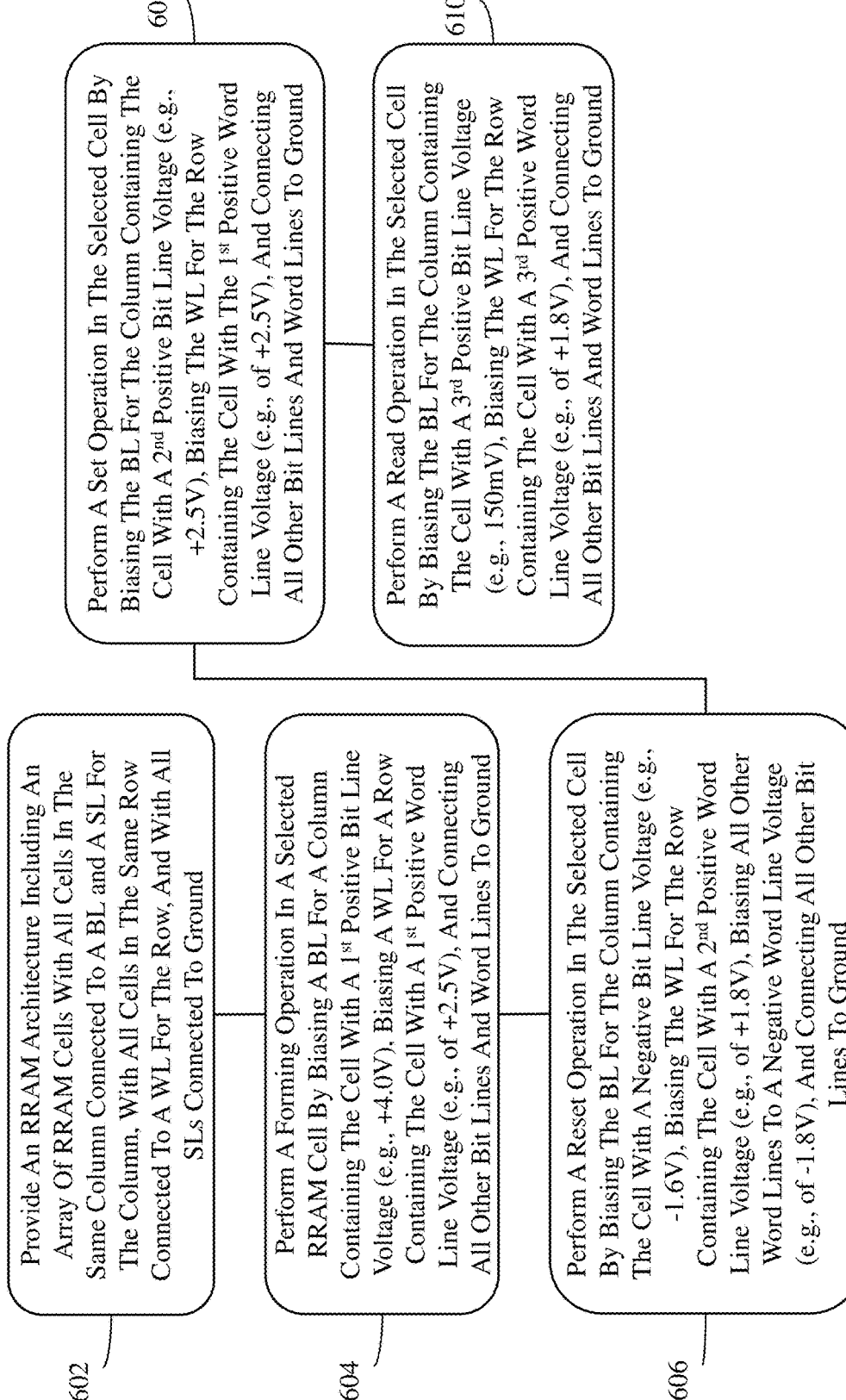

Provide An RRAM Architecture Including An Array Of RRAM Cells With All Cells In The Same Column Connected To A BL and A SL For The Column, With All Cells In The Same Row Connected To A WL For The Row, And With All SLs Connected To Ground

602

Perform A Forming Operation In A Selected RRAM Cell By Biasing A BL For A Column Containing The Cell With A 1st Positive Bit Line Voltage (e.g., +4.0V), Biasing A WL For A Row Containing The Cell With A 1st Positive Word Line Voltage (e.g., of +2.5V), And Connecting All Other Bit Lines And Word Lines To Ground

604

Perform A Reset Operation In The Selected Cell By Biasing The BL For The Column Containing The Cell With A Negative Bit Line Voltage (e.g., -1.6V), Biasing The WL For The Row Containing The Cell With A 2nd Positive Word Line Voltage (e.g., of +1.8V), Biasing All Other Word Lines To A Negative Word Line Voltage (e.g., of -1.8V), And Connecting All Other Bit Lines To Ground

606

Perform A Set Operation In The Selected Cell By Biasing The BL For The Column Containing The Cell With A 2nd Positive Bit Line Voltage (e.g., +2.5V), Biasing The WL For The Row Containing The Cell With The 1st Positive Word Line Voltage (e.g., of +2.5V), And Connecting All Other Bit Lines And Word Lines To Ground

608

Perform A Read Operation In The Selected Cell By Biasing The BL For The Column Containing The Cell With A 3rd Positive Bit Line Voltage (e.g., 150mV), Biasing The WL For The Row Containing The Cell With A 3rd Positive Word Line Voltage (e.g., of +1.8V), And Connecting All Other Bit Lines And Word Lines To Ground

RESISTIVE RANDOM ACCESS MEMORY (RRAM) ARCHITECTURE AND METHOD

BACKGROUND

The present disclosure relates to resistive random access memories (RRAMs) and, more particularly, to embodiments of an RRAM structure and of a method of operating the RRAM structure.

Conventional RRAM architectures include an array of RRAM cells arranged in columns and rows. Each RRAM cell can be, for example, a one-transistor one-resistor (1T1R) memory cell. RRAM cells in each column can be connected between a bit line and a source line for the column. RRAM cells in each row can be connected to a word line for the row. Specifically, each RRAM cell in a given column and a given row can include: a programmable resistor with a first terminal connected to the bit line for the column and a second terminal opposite the first terminal; and an access transistor (e.g. a N-type field effect transistor) including a first source/drain region connected to the second terminal of the programmable resistor, a second source/drain region connected to the source line for the column, and a gate connected to the word line for the row. Write operations in a selected RRAM cell can include: a forming operation during which an initial high resistance state (HRS) of the programmable resistor is switched to a low resistance state (LRS); a reset operation during which the LRS of the programmable resistor is switched back to an HRS; and a set operation during which the HRS of the programmable resistor is again switched to the LRS. Whether a forming or set operation is performed or whether a reset operation is performed depends on the voltage level of a positive word line voltage applied to the word line of the column containing the selected RRAM cell and either the voltage level of a positive source line voltage applied to the source line of the column containing the selected RRAM cell or the voltage level of a positive bit line voltage applied to the bit line of the column containing the selected RRAM cell. To selectively apply certain positive voltages to a word line and either a bit line or a source line to achieve a particular operation (e.g., forming, reset, or set) within a selected RRAM cell requires complex, area-consuming, peripheral circuitry and may result in poor performance (e.g., a high bit error rate (BER)) and/or undue device stress.

SUMMARY

Disclosed herein are embodiments of a resistive random access memory (RRAM) structure.

In some embodiments, the RRAM structure can include source lines and bit lines. The RRAM structure can further include an array of RRAM cells arranged in columns and rows. All RRAM cells in a column can be connected between a source line and a bit line for the column. In the RRAM structure, the source lines can be continuously connected to ground and the bit lines can be connected to receive bit line voltages, respectively, with each bit line voltage received by a bit line being operation-dependent, being bit line connection-dependent, and further being at any one of multiple positive bit line voltage levels, a negative bit line voltage level, or ground.

In other embodiments, the RRAM structure can include multiple zones. Each zone can include source lines, bit lines, and word lines. Each zone can further include a zone-specific array of RRAM cells arranged in columns and rows. All RRAM cells in a column can be connected between a source line and a bit line for the column and all RRAM cells in a row can be connected to a word line for the row. The RRAM structure can further include a zone-specific bit line biasing circuit connected to the bit lines and a zone-specific word line biasing circuit connected to the word lines. The zone-specific bit line biasing circuit can bias the bit lines with bit line voltages, respectively, with each bit line voltage received by a bit line being operation-dependent, being bit line connection-dependent, and further being at any one of multiple positive bit line voltage levels, a negative bit line voltage level, or ground. The zone-specific word line biasing circuit can bias the word lines with word line voltages, respectively, with each word line voltage received by a word line being operation-dependent, being word line connection-dependent, and further being at any one of multiple positive word line voltage levels, a negative word line voltage level, or ground. The RRAM structure can further include an analog block connected to each of multiple zones for providing the necessary power supplies needed for bit line and word line biasing.

Also disclosed herein are embodiments of a method associated with operating an RRAM structure. For example, the method can include providing an RRAM structure that includes source lines, bit lines, word lines, and an array of RRAM cells arranged in columns and rows. All RRAM cells in a column can be connected between a source line and a bit line for the column and all RRAM cells in a row can be connected to a word line for the row. The method can further include biasing bit lines of an RRAM structure with bit line voltages, respectively, and concurrently biasing word lines of the RRAM structure with word line voltages, respectively. Biasing of the bit lines can include biasing each bit line with a bit line voltage that is operation-dependent, bit line connection-dependent, and at any one of multiple positive bit line voltage levels, a negative bit line voltage level, or ground. Biasing of the word lines can include biasing each word line with a word line voltage that is operation-dependent, word line connection-dependent, and at any one of multiple positive word line voltage levels, a negative word line voltage level, or ground.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIG. 3 includes a table illustrating examples of operation-dependent and word line connection-dependent word line voltages as well as operation-dependent and bit line connection-dependent bit line voltages;

FIG. 6 is a flow diagram illustrating disclosed embodiments of an RRAM structure operating method.

DETAILED DESCRIPTION

Figure 1:
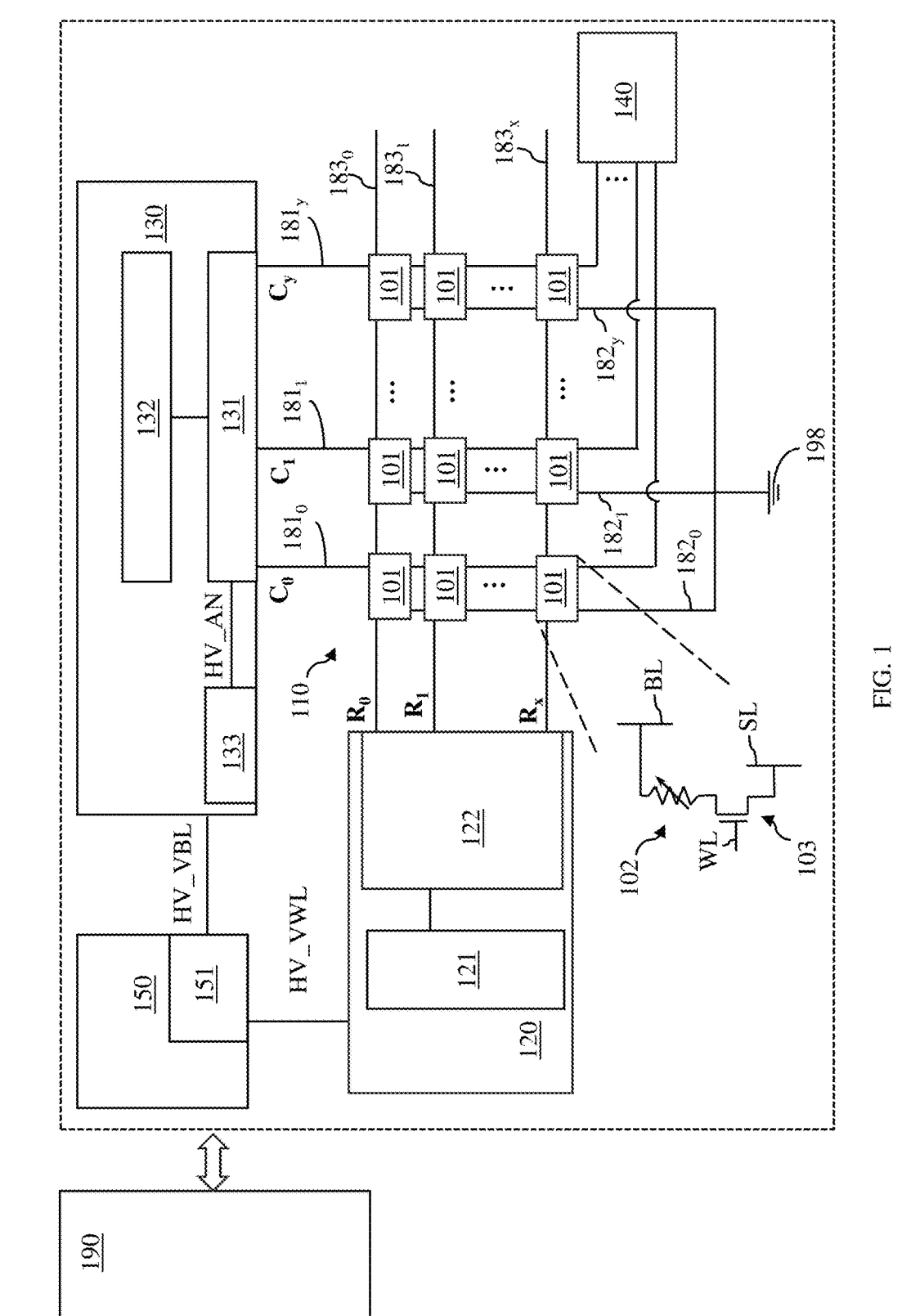
FIG. 1 is a schematic drawing illustrating a disclosed embodiment of an RRAM structure.

As mentioned above, conventional RRAM architectures include an array of RRAM cells arranged in columns and rows. Each RRAM cell can be, for example, a one-transistor one-resistor (1T1R) memory cell. RRAM cells in each column can be connected between a bit line and a source line for the column. RRAM cells in each row can be connected to a word line for the row. Specifically, each RRAM cell in a given column and a given row can include: programmable resistor with a first terminal connected to the bit line for the column and a second terminal opposite the first terminal; and an access transistor (e.g. an N-type field effect transistor) including a first source/drain region connected to the second terminal of the programmable resistor, a second source/drain region connected to the source line for the column, and a gate connected to the word line for the row. Write operations in a selected RRAM cell can include: a forming operation during which an initial high resistance state (HRS) of the programmable resistor is switched to a low resistance state (LRS); a reset operation during which the LRS of the programmable resistor is switched back to an HRS; and a set operation during which the HRS of the programmable resistor is again switched to the LRS.

More specifically, during a forming operation to change an initial HRS of a programmable resistor of a selected RRAM cell to a LRS (e.g., to store a logic value of "1"), a high positive voltage (e.g., of +2.5V) can be applied to the word line of the row containing the selected RRAM cell and an even higher positive voltage (e.g., of +4.0V) can be applied to the source line of the column containing the selected RRAM cell. Meanwhile, the bit line of the column containing the selected RRAM cell, the word lines of all other rows, and the bit lines and source lines of all other columns can be connected to ground. During a reset operation (also referred to herein as an erase operation) to switch the programmable resistor of a selected RRAM cell from the LRS back to a HRS (e.g., to store a logic value of "0"), a high positive voltage (e.g., of +3.8V) can be applied to the word line of the row containing the selected RRAM cell and a different high positive voltage (e.g., +3.0V) can be applied to the bit line of the column containing the selected RRAM cell. Meanwhile, the source line of the column containing the selected RRAM cell, the word lines of all other rows, and the bit lines and source lines of all other columns are discharged to ground. During a set operation (also referred to herein as a program operation) to switch the programmable resistor of a selected RRAM cell from the HRS back to the LRS (e.g., to again store a logic value of "1"), positive voltages (e.g., of +2.5 volts (V)) can be applied to both the word line of the row containing the selected RRAM cell and the source line of the column containing the selected RRAM cell. Meanwhile, the bit line of the column containing the selected RRAM cell, the word lines of all other rows, and the bit lines and source lines of all other columns are discharged to ground. To provide such high voltages to a word line and a bit line or a source line (depending on whether the operation is a forming/set operation or a reset operation), while connecting all others word lines, bit lines and source lines to ground, requires complex, area-consuming, peripheral circuitry and may result in poor performance (e.g., a high bit error rate (BER)) and/or undue device stress.

In view of the foregoing, disclosed herein are embodiments of a resistive random access memory (RRAM) structure configured for optimal power, performance, and area (PPA) and a method of operating the RRAM structure. The RRAM structure can include an array of RRAM cells arranged in columns and rows with all cells in a column connected between source and bit lines for the column and with all cells in a row connected to a word line for the row. The source lines can be continuously connected to ground. The RRAM structure can further include peripheral circuitry configured to enable all memory operations (e.g., forming, reset, set, and read) to be performed without selective source line biasing. Furthermore, the peripheral circuitry can be configured to enable reset operations to be performed without the use of high positive voltages (e.g., without the use of positive voltages greater than +1.8V). For example, during a reset operation to change the programmable resistor of a selected RRAM cell from a low resistance state (LRS) to a high resistance state (HRS), the following voltage conditions can be applied: a relatively low positive voltage (e.g., of +1.8V as opposed to +3.8V) to the word line of the row containing the selected RRAM cell; a relatively low negative voltage (e.g., of −1.8V as opposed to 0.0V) to all other word lines; and another relatively low negative voltage (e.g., of −1.6V as opposed to +3.0V) to the bit line of the column containing the selected RRAM cell. During this reset operation, all other bit lines can be connected to ground (along with the source lines that are continuously connected to ground, as mentioned above). Thus, high positive voltages (e.g., over +1.8V) are not required for use during reset operations to accommodate current*resistance (IR) drops. Additionally, no source line biasing circuitry is required. As a result, the disclosed RRAM structure may employ less power, consume less area, include fewer devices under stress, and exhibit a reduced BER so that PPA is optimized.

More particularly, FIG. 1 is a schematic diagram illustrating a disclosed embodiment of a memory structure and, particularly, a disclosed embodiment of a resistive random access memory (RRAM) architecture (hereinafter referred to as structure 100).

Structure 100 can include: an array 110 of RRAM cells 101 arranged in columns (C0-Cy) and rows (R0-Rx); bit lines $181_0$-$181_y$ for the columns (C0-Cy), respectively; source lines $182_0$-$182_y$ for the columns (C0-Cy), respectively; and word lines $183_0$-$183_x$ for the rows (R0-Rx), respectively. Generally, each RRAM cell 101 can include a programmable resistor 102 and an access transistor 103 (e.g., an N-type field effect transistor (NFET)) connected in series. All RRAM cells 101 in the same column can be connected to a corresponding bit line-source line pair for that column. That is, in the same column, each RRAM cell 101 can have a programmable resistor 102 and access transistor 103 (e.g., NFET) connected in series between the bit line for the column and the source line for the column. Additionally, all RRAM cells 101 in the same row can be connected to a corresponding word line for that row. That is, in the same row, each RRAM cell 101 can include a programmable resistor 102 connected to an access transistor 103 (e.g., NFET) and the gate of the access transistor 103 can be electrically connected to the word line for the row.

FIGS. 2A-2D are cross-section diagrams illustrating, in greater detail, an example of an RRAM cell 101 including programmable resistor 102 and access transistor 103 that can be incorporated into the array 110 of FIG. 1. FIGS. 2A-2D further show RRAM cell 101 with the programmable resistor 102 in different programming states, respectively.

Figure 2B:
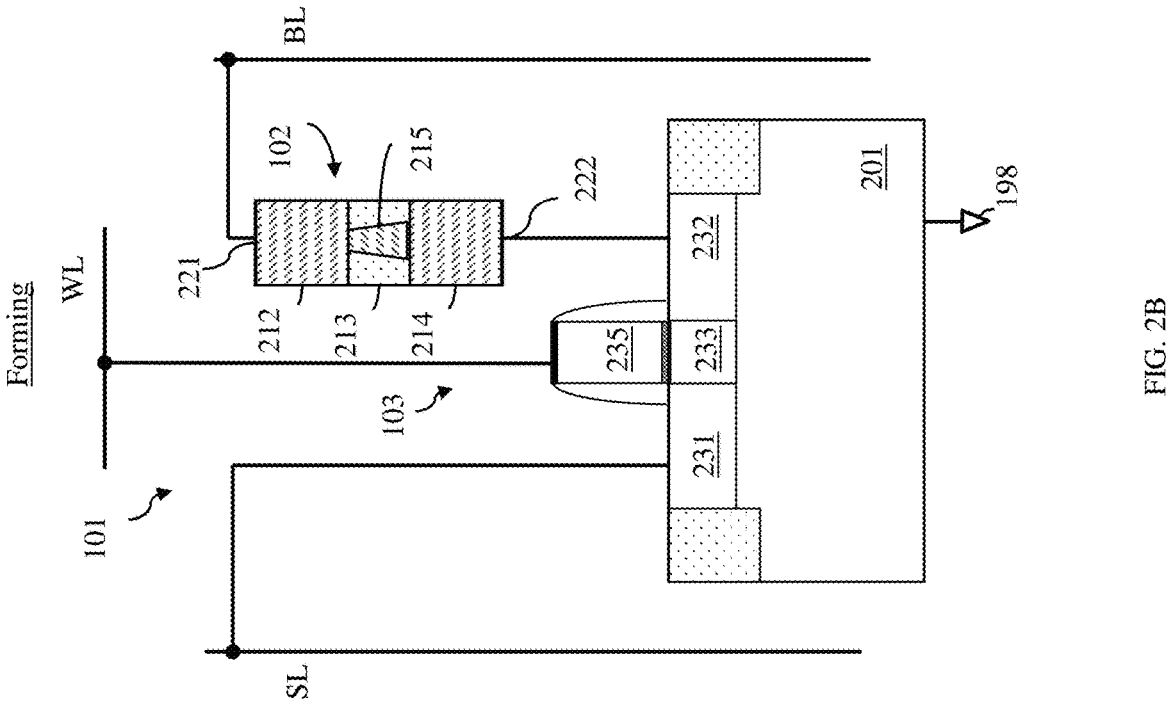
FIGS. 2A-2D are cross-section diagrams illustrating an example of RRAM cell and different programming states thereof.
Figure 2A:
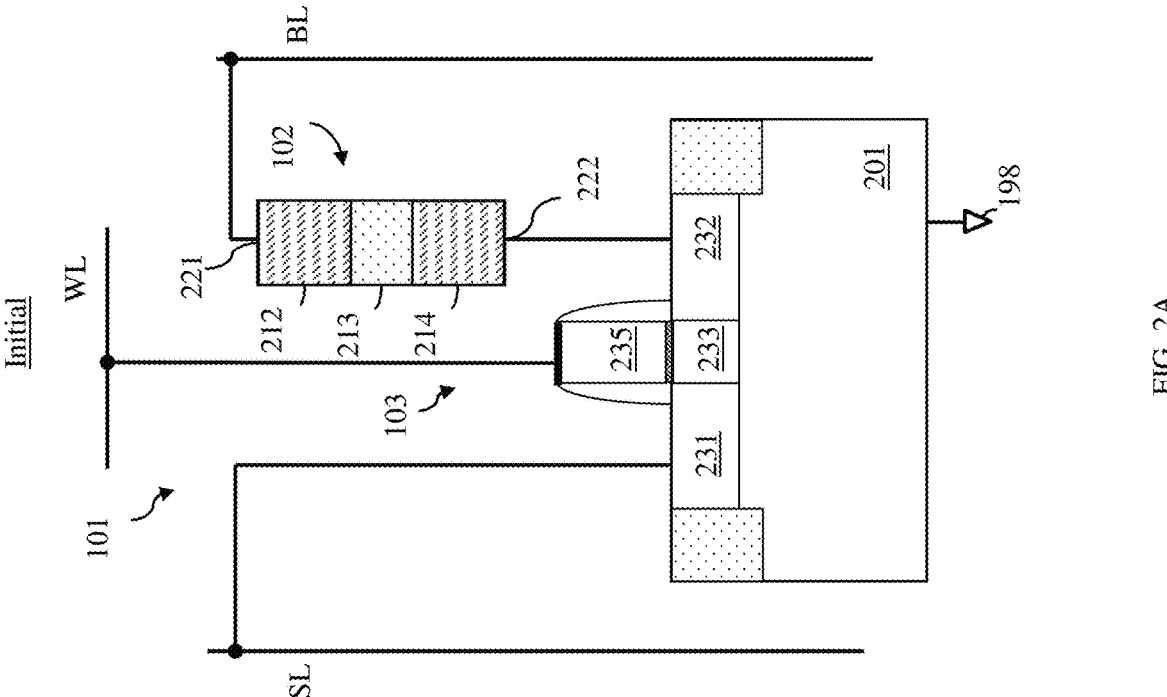
Figure 2D:
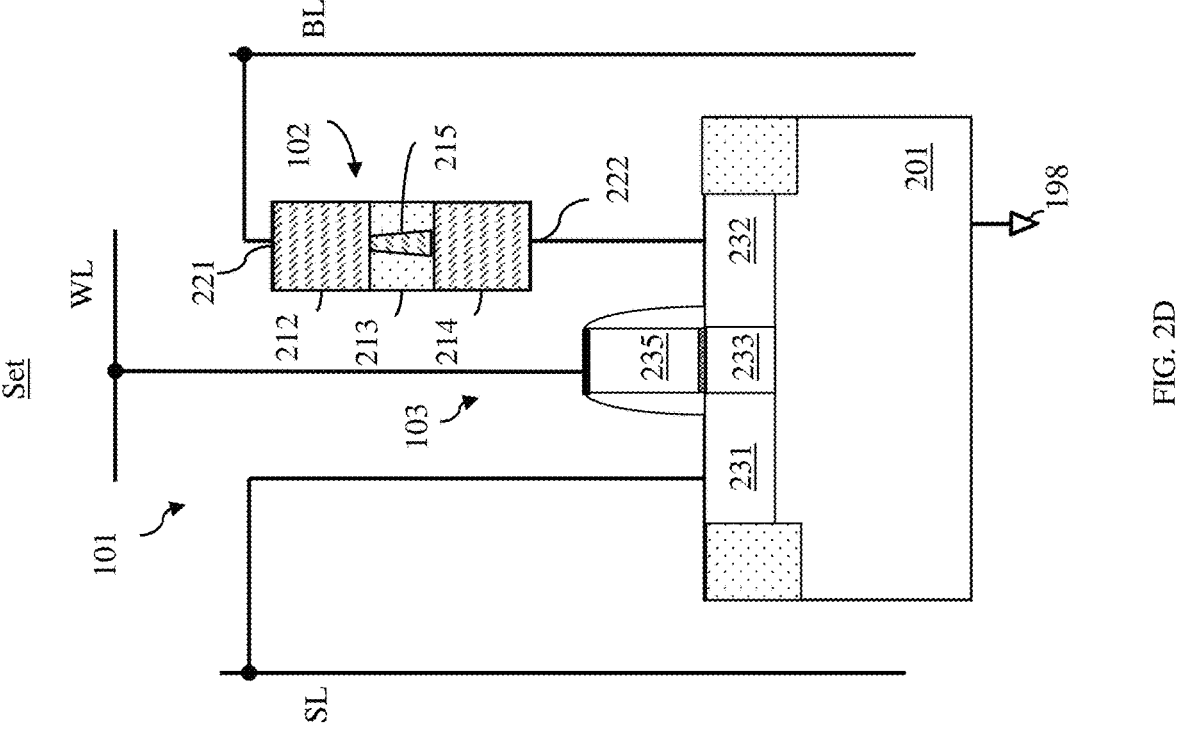
Figure 2C:
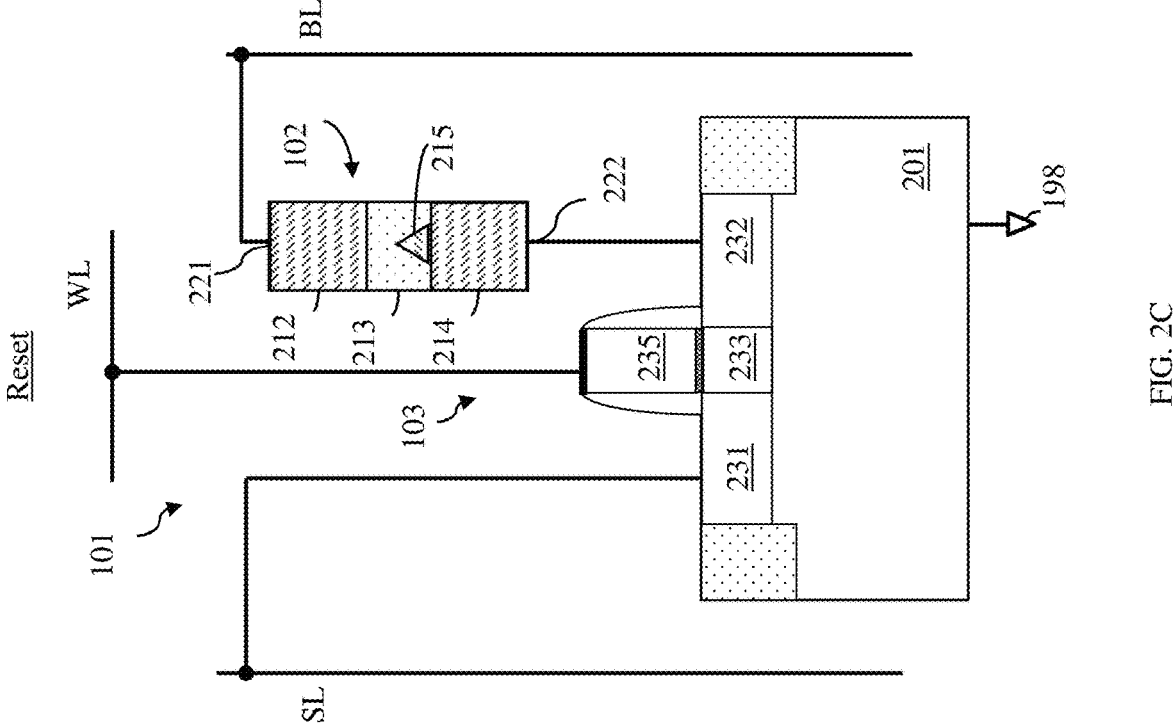

In any case, as illustrated in FIGS. 2A-2D, programmable resistor 102 can be a memristor or other similar type of programmable resistor having two-terminals (i.e., a first terminal 221 and a second terminal 222). Programmable resistor 102 can, for example, be a back end of the line (BEOL) multi-layer structure and, particularly, a BEOL metal-insulator-metal (MIM) structure. The MIM structure can include a first metal layer 212 (at first terminal 221). First metal layer 212 can include one or more layers of metal or metal alloy materials (e.g., titanium, titanium nitride and/or any other suitable metal or metal alloy material). The MIM structure can further include a second metal layer 214 (at second terminal 222). The second metal layer 214 can include one or more layers of metal or metal alloy materials (e.g., titanium, titanium nitride and/or any other suitable metal or metal alloy material). The MIM structure can further include an insulator layer 213 (also referred to as a switching layer) stacked between the two metal layers 212 and 214 and including one or more layers of isolation material (e.g., hafnium oxide and/or any other suitable insulator material). As illustrated in FIG. 2A, the initial (post-manufacture) state of programmable resistor 102 can be a high resistance state (HRS). As illustrated in FIG. 2B, during a forming operation (as discussed in greater detail below), specific bias voltages on terminals 221 and 222 can be employed to switch programmable resistor 102 to a low resistance state (LRS) (e.g., by causing metal ion migration resulting in the formation of conductive filament(s) 215 extending through insulator layer 213 between and contacting metal layers 212 and 214). As illustrated in FIG. 2C, during a reset operation (also referred to herein as an erase operation to, for example store a logic value of "0", as discussed in greater detail below), specific bias voltages on the terminals 221 and 222 can be employed to switch programmable resistor 102 back to a HRS (e.g., by causing metal ion migration resulting in the break-up of conductive filament(s) 215 extending through insulator layer 213 so metal layers 212 and 214 are no longer electrically connected, as illustrated). As illustrated in FIG. 2D, during a set operation (also referred to herein as a programming operation to, for example, store a logic value of "1", as discussed in greater detail below), specific bias voltages on the terminals 221 and 222 can be employed to switch programmable resistor 102 back to a LRS. The above-described operations (e.g., forming, reset, and set) are collectively referred to herein as write operations.

Also as illustrated in FIGS. 2A-2D, access transistor 103 can be a field effect transistor (FET), such as an NFET. Specifically, access transistor 103 can include a first N-type source/drain 231, a second N-type source/drain region 232, and a channel region 233 (e.g., a P-channel region or intrinsic channel region) between the two source/drain regions 231-232. Optionally, the source/drain regions and channel region therebetween can be within an upper portion of a semiconductor layer or semiconductor substrate 201, which has, for example, P-conductivity and which is electrically connected to ground 198. Access transistor 103 can further include a gate 235 adjacent to channel region 233. Various different NFET configurations are known in the art, any of which could be incorporated into an RRAM cell. Thus, a more detailed description of the NFET has been omitted from the specification in order to allow the reader to focus on the salient aspects of the disclosed embodiments. In any case, within the RRAM cell 101, first terminal 221 of programmable resistor 102 can be electrically connected to a BL for a specific column. Second terminal 222 of programmable resistor 102 can be electrically connected to source/drain region 232 of access transistor 103. Source/drain region 231 of access transistor 103 can be electrically connected to a SL for the specific column and gate 235 of access transistor 103 can be connected to a WL for a given row.

As noted above, in conventional RRAM architectures, a write operation in a selected RRAM cell in an array of RRAM cells is typically performed using positive voltages (e.g., ranging from as low as +1.8V to up to +4V) applied to the WL for the row containing the selected RRAM cell and either to the SL or the BL for the column containing the selected cell. All other word lines, bit lines, and source lines are selectively connected to ground. The parameters such as: (a) the particular voltage levels used for biasing the WL and for biasing the SL or the BL, and (b) whether the SL or the BL is positively biased depend on whether the write operation to be performed in the selected RRAM cell is a forming operation, a reset operation, or a set operation. In other words, these parameters are operation-dependent. Such biasing requires a combination of a word line biasing circuit, a bit line biasing circuit, and a source line biasing circuitry.

Referring again to FIG. 1, structure 100 includes peripheral circuitry including, but not limited to, a bit line biasing circuit 130 (also referred to herein as a column decode block) electrically connected to bit lines $181_0$-$181_y$, a word line biasing circuit 120 (also referred to herein as a row decode block) electrically connected to word lines $183_0$-$183_x$ and additional circuitry (including, but not limited to, an anode driver 133 and an analog block 150 with a positive/negative charge pump 151). The peripheral circuitry of structure 100 does not, however, include a source line biasing circuit. Instead, all source lines $182_0$-$182_y$ are continuously electrically connected to ground 198 and the peripheral circuitry is configured to facilitate performance of the various write operations (i.e., forming, reset, and set operations) and read operations without selectively biasing source lines $182_0$-$182_y$. That is, in structure 100, the peripheral circuitry is configured to enable word lines $183_0$-$183_x$ to receive positive, negative, or ground word line voltages from word line biasing circuit 120 and to enable bit lines $181_0$-$181_y$ to receive positive, negative, or ground voltages from bit line biasing circuit 130. The actual word line voltage (i.e., positive, negative, or ground) received by any given word line from word line biasing circuit 120 will be both operation-dependent and also word line connection-dependent. Similarly, the actual bit line voltage received by any given bit line from bit line biasing circuit 130 will be both operation-dependent and also bit line connection-dependent.

For purposes of this disclosure, "operation-dependent" refers to whether the operation being performed in a selected RRAM cell is a forming operation, a reset operation, a set operation, or a read operation. "Word line connection-dependent" refers to being dependent on whether the word line at issue is for a row containing the selected RRAM cell and, thus, is connected to the selected RRAM cell or whether the word line at issue is for a row not containing the selected RRAM cell and, thus, not connected to the selected RRAM cell. Similarly, "bit line connection-dependent" refers to being dependent on whether the bit line at issue is for a column containing the selected RRAM cell and, thus, connected to the selected RRAM cell or whether the bit line at issue is for a column that does not contain the selected RRAM cell and, thus, is not connected to the selected RRAM cell.

Figure 4:
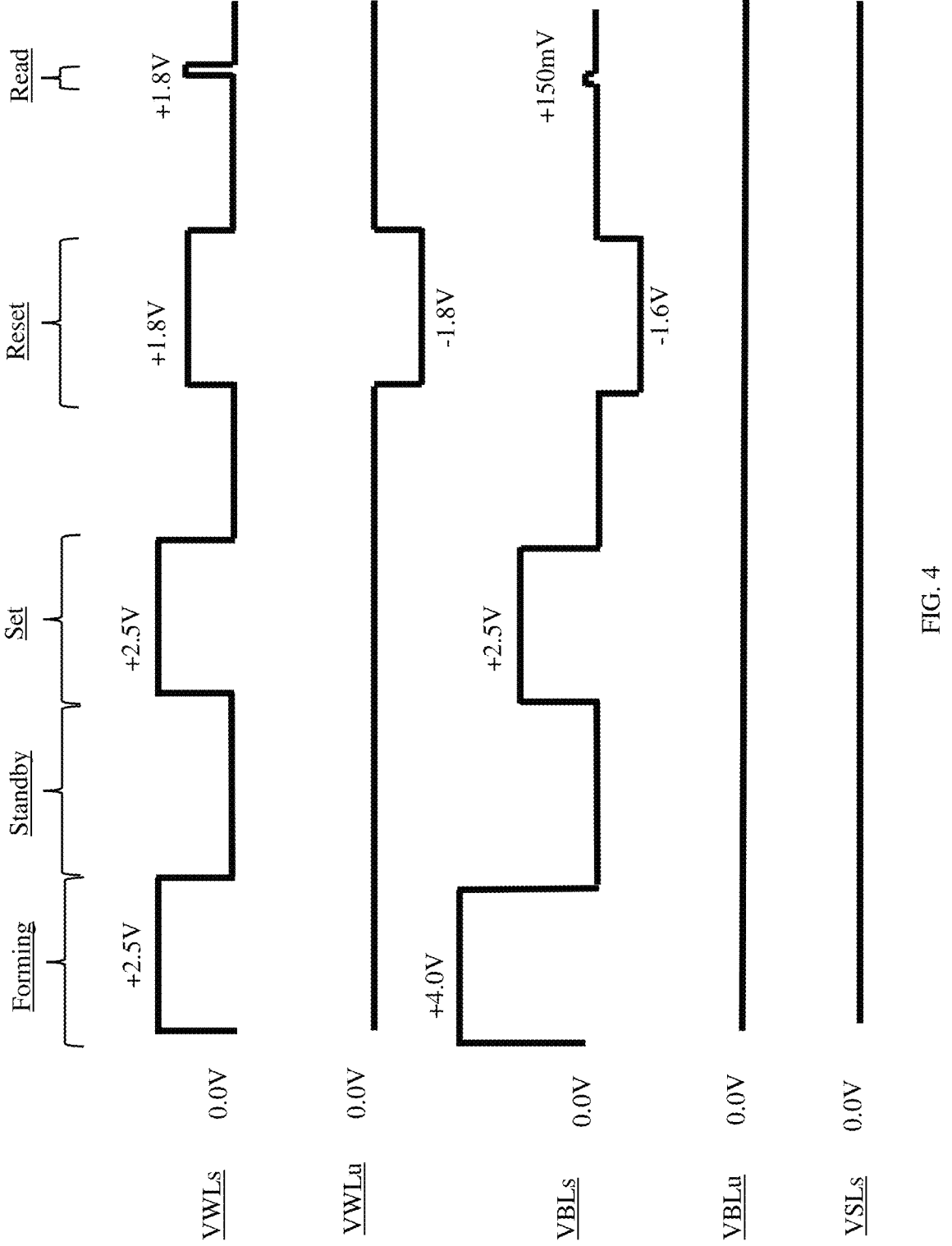
FIG. 4 includes a timing diagram illustrating the voltage conditions set forth in the table of FIG. 3.

FIG. 3 includes a table illustrating examples of word line voltages and bit line voltages that can be employed in structure 100 during a forming operation, a set operation, a reset operation, or a read operation of a selected RRAM cell. FIG. 4 is a timing diagram illustrating the same voltage conditions set forth in FIG. 3. As indicated, the word line voltages are operation-dependent and word line connection-dependent and the bit line voltages are operation-dependent and bit line connection-dependent.

For example, a forming operation directed to a selected RRAM cell in a specific column and a specific row can be performed to change the programming state of programmable resistor 102 in the selected RRAM cell from an initial high resistance state (HRS), as shown in FIG. 2A, to a formed low resistance state (LRS), as shown in FIG. 2B. In this case, bit line biasing circuit 130 can bias the specific BL for the specific column containing the selected RRAM cell with a high first positive bit line voltage (e.g., of approximately +4.0V) and can connect all other bit lines (i.e., BLs for columns not containing the selected RRAM) to ground (e.g., to 0.0V). Concurrently, during this forming operation, the word line biasing circuit 120 can bias the specific WL for the specific row containing the selected RRAM with a first positive word line voltage (e.g., of approximately +2.5V), which is lower than the first positive bit line voltage, and can connect all other word lines (i.e., WLs for rows not containing the selected RRAM cell) to ground (e.g., to 0.0V). In this case, when access transistor 103 turns on in response to the first positive word line voltage, current flows through access transistor 103 from the BL to the SL, thereby creating conductive filament(s) 215.

Reset or set operations directed to the same selected RRAM cell can be performed subsequent to the forming operation.

A reset operation directed to the same selected RRAM cell can be performed to reset the programming state of programmable resistor 102 at a HRS (e.g., to store a logic value of "0") as shown in FIG. 2C. In this case, bit line biasing circuit 130 can bias the specific BL for the specific column containing the selected RRAM cell with a negative bit line voltage (e.g., of approximately −1.6V) and can connect all other bit lines (i.e., BLs for columns not containing the selected RRAM) to ground (e.g., to 0.0V). Concurrently, during this reset operation, the word line biasing circuit 120 can bias the specific WL for the specific row containing the selected RRAM with a second positive word line voltage (e.g., of approximately +1.8V), which is lower than the first positive word line voltage, and can connect all other word lines (i.e., WLs for rows not containing the selected RRAM cell) to a negative word line voltage (e.g., of approximately −1.8V), which is lower than the negative bit line voltage to prevent access transistor in non-selected RRAM cells from turning on. In this case, when access transistor 103 turns on in response to the second positive word line voltage, current flows through access transistor 103 from the SL (at 0.0V) to the BL (at −1.6V), thereby breaking up/reducing conductive filament(s) 215.

A set operation directed to the same selected RRAM cell can be performed to set the programming state of programmable resistor 102 at a LRS (e.g., to store a logic value of "1"), as shown in FIG. 2D. In this case, bit line biasing circuit 130 can bias the specific BL for the specific column containing the selected RRAM cell with a second positive bit line voltage (e.g., of approximately +2.5V), which is lower than the first positive bit line voltage (e.g., of +4.0V) used for the forming operation, and can connect all other bit lines (i.e., BLs for columns not containing the selected RRAM) to ground (e.g., to 0.0V). Concurrently, during this set operation, the word line biasing circuit 120 can bias the specific WL for the specific row containing the selected RRAM with the first positive word line voltage (e.g., of approximately +2.5V) (i.e., the same positive word line voltage that was used during forming) and can connect all other word lines (i.e., WLs for rows not containing the selected RRAM cell) to ground (e.g., to 0.0V). In this case, when access transistor 103 turns on in response to the first positive word line voltage, current again flows through access transistor 103 from the BL to the SL, thereby reforming/repairing conductive filament(s) 215.

A read operation directed to the same selected RRAM cell can be performed at any time to determine the logic value stored therein. During the read operation, bit line biasing circuit 130 can bias the specific BL for the specific column containing the selected RRAM cell with a third positive bit line voltage (referred to herein as VREAD) and can connect all other bit lines (i.e., BLs for columns not containing the selected RRAM cell) to ground (e.g., 0.0V). Concurrently, during this read operation, the word line biasing circuit 120 can bias the specific WL for the specific row containing the selected RRAM with a third positive word line voltage (referred to herein as +VDDW) and can connect all other word lines (i.e., WLs for rows not containing the selected RRAM cell) to ground (e.g., 0.0V). In some embodiments, VREAD can be approximately +150 mV and +VDDW can be approximately +1.8V. Structure 100 can further include a sense circuit 140, which is electrically connected to bit lines $181_0$-$181_y$. Sense circuit 140 can include one or more sense amplifiers configured to sense a change in an electrical parameter (e.g., voltage or current) on the specific BL connected to the selected RRAM cell when access transistor 103 turns on in response to +VDDW. Based on the sensed electrical parameter, sense circuit 140 can output a data output value indicative of the logic value "1" or "0" stored in the selected RRAM cell. A variety of different sense circuit configurations are known in the art and could be incorporated into structure 100. Thus, the details thereof have been omitted from the specification in order to allow the reader to focus on the salient aspects of the disclosed embodiments.

In order to facilitate biasing bit lines $181_0$-$181_y$ with positive, negative, or ground bit line voltages and word lines $183_0$-$183_x$ with positive, negative, or ground word line voltages, the peripheral circuitry of structure 100 can further include an analog block 150. Analog block 150 can include one or more positive/negative output charge pumps 151. Charge pump(s) 151 can be configured to output a first supply voltage (HV_VBL) to bit line biasing circuit 130 and a second supply voltage (HV_VWL) to word line biasing circuit 120. The first and second supply voltages (HV_VBL and HV_VWL) are each selectable from a range of negative to positive supply voltages enable bit line biasing circuit 130 to bias the bit lines and word line biasing circuit 120 to bias the word lines, as needed. For example, charge pump(s) 151 can be configured so that the first and second supply voltages (HV_VBL and HV_VWL) are selectable from a range of negative to positive supply voltages of −1.8V to 0.0V and 0.0V to at least +4.0V. Positive/negative output charge pumps are known in the art and, thus, the details thereof have been omitted from the specification in order to allow the reader to focus on the salient aspects of the disclosed embodiments.

Bit line biasing circuit 130 can be in communication with a controller 190 and can include, for example, a column decode block 132 (including bit line drivers). Column decode block 132 can be connected to receive column control signals (e.g., column address signals) from controller 190 and can be configured to decode the signals into decoded column control signals. Bit line biasing circuit 130 can further include a bit line multiplexor (BL MUX) 131 in communication with the column decode block 132 and electrically connected to bit lines $181_0$-$181_y$. Bit line biasing circuit 130 can further include an anode driver 133 connected to BL MUX 131. Anode driver 133 can be configured to provide, to BL MUX 131, the required power supply for biasing the bit lines. BL MUX 131 can be configured to receive the decoded column control signals and, in response to the decoded column control signals and using the power supply provided by anode driver 133, selectively apply appropriate bit line voltages to bit lines $181_0$-$181_y$ during the memory cell operations. With the above-described configuration, bit line biasing circuit 130 can be controlled by controller 190 to apply the operation-dependent and bit line connection-dependent bit line voltages, as described above.

Word line biasing circuit 120 can be in communication with controller 190 and can include, for example, pre-driver and row decode blocks 121-122. These blocks 121-122 can, in combination, be configured to receive row control signals (e.g., row address signals) from controller 190 and decode the signals into decoded row control signals. Row decode block 122 can further be electrically connected to word lines $183_0$-$183_x$ and, as indicated by the decoded row control signals, selectively apply appropriate word line voltages to word lines $183_0$-$183_x$ during memory cell operations. With the above-described configuration, word line biasing circuit 120 can be controlled by controller 190 to apply the operation-dependent and word line connection-dependent word line voltages, as described above.

Figure 5:
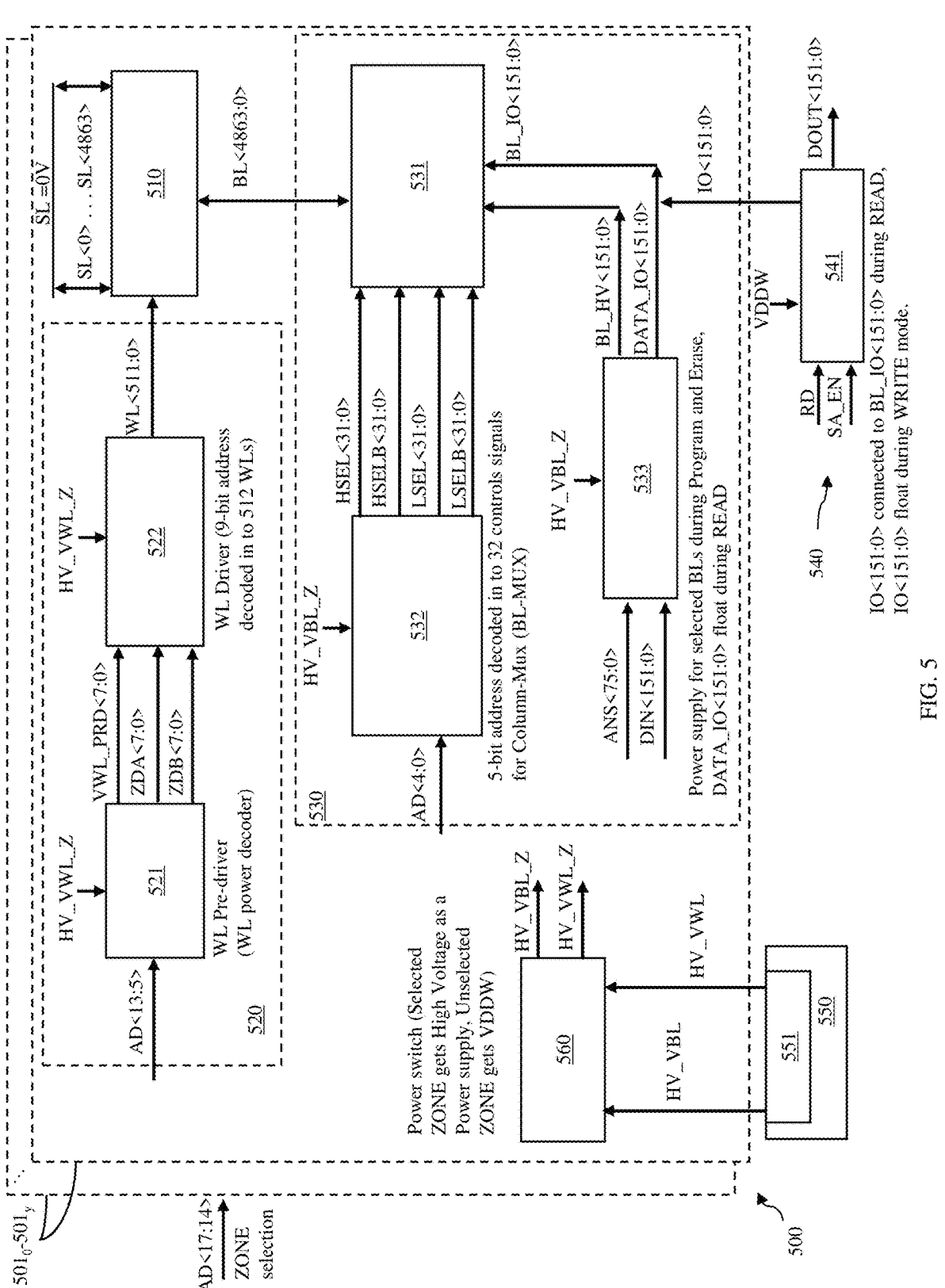
FIG. 5 is a schematic diagram illustrating another disclosed embodiment of an RRAM structure.

FIG. 5 is a schematic diagram illustrating another disclosed embodiment of a memory structure and, particularly, another disclosed embodiment of a resistive random access memory (RRAM) architecture (hereinafter referred to as structure 500). Structure 500 is similar to structure 100, except, instead of including a single memory array 110, structure 500 includes multiple zones $501_0$-$501_y$. Zones $501_0$-$501_y$ can be configured in essentially the same manner. For purposes of illustration and to avoid clutter in the figures, only the components of zone $501_0$ are shown in FIG. 5. Each zone $501_0$-$501_y$ includes a zone-specific array 510 of RRAM cells. Zone-specific array 510 can be configured in essentially the same manner as array 110 described in detail above and illustrated in FIG. 1. That is, although not illustrated, it should be understood that zone-specific array 510 can include RRAM cells arranged in columns and rows, with all RRAM cells in the same column connected to a bit line and source line for the column and with all RRAM cells in the same row connected to a word line for the row. All source lines can be continuously connected to ground.

Each zone $501_0$-$501_y$ can further include a zone-specific bit line biasing circuit 530 configured to perform operation-dependent and bit line connection-dependent biasing of bit lines, as discussed above with regard to FIG. 1 and illustrated, for example, in FIGS. 3 and 4. More specifically, zone-specific bit line biasing circuit 530 can include a BL MUX 531 connected to the bit lines of the zone-specific array 510 and, connected to the BL MUX 531, a column decode block 532 and an anode driver 533. Column decode block 532 can be connected to receive column control signals (e.g., column address signals) and can be configured to decode the signals into decoded column control signals. Anode driver 533 can be configured to provide BL MUX 531 with the power supply required for biasing the bit lines.

BL MUX 531 can be configured to receive the decoded column control signals from column decode block 532 and, in response to the decode column control signals and using the power supply from anode driver 533, selectively apply appropriate bit line voltages to bit lines of array 510 during the memory cell operations Each zone $501_0$-$501_y$ can further include a zone-specific word line biasing circuit 520 configured to perform operation-dependent and word line connection-dependent biasing of word lines, as discussed above with regard to FIG. 1 and illustrated, for example, in FIGS. 3 and 4. More specifically, zone-specific word line biasing circuit 520 can include pre-driver and row decode blocks 521-522. These blocks 521-522 can, in combination, be configured to receive row control signals (e.g., row address signals) and decode the signals into decoded row control signals. Row decode block 522 can further be electrically connected to word lines of zone-specific array 510 and, as indicated by the decoded row control signals, selectively apply appropriate word line voltages to word lines of array 510 during memory cell operations.

Structure 500 can further include a global analog block 550 including one or more positive/negative output charge pumps 551. Charge pump(s) 551 can be configured to output a first supply voltage (HV_VBL) and a second supply voltage (HV_VWL). The first and second supply voltages (HV_VBL and HV_VWL) are each selectable from a range of negative to positive supply voltages enable bit line biasing and word lien biasing, as needed. For example, charge pump(s) 551 can be configured so that the first and second supply voltages (HV_VBL and HV_VWL) are selectable from a range of negative to positive supply voltages of −1.8V to 0.0V and 0.0V to at least +4.0V. Each zone $501_0$-$501_y$ can further include a zone-specific power switch 560, which is connected to global analog block 550 and further to zone-specific bit line biasing circuit 530 and zone-specific word line biasing circuit 520. Within a zone $501_0$-$501_y$, zone-specific power switch 560 can be selectively turned on to supply the first supply voltage (HV_VBL_Z) and the second supply voltage (HV_VWL_Z) to zone-specific biasing circuits 520 and 530, respectively, when a write or read operation is to be performed in the zone-specific array 510 or turned off when no such operations are to be performed therein.

In operation, an input address (AD<17:14>) can be employed to select a zone (e.g., zone $501_0$) of the multiple zones $501_0$-$501_y$ in structure 500 for performance of a memory cell operation (e.g., a write or read) in a specific RRAM cell within the zone-specific array 510 contained therein. When a zone is selected as indicated by an input address (e.g., zone $501_0$ as indicated by address AD<17:14>=0000), the zone-specific power switch 560 contained in that selected zone can be controlled to selectively the first and second supply voltages (HV_VBL_Z and HV_VWL_Z) to the zone-specific bit line and word line biasing circuits 520 and 530, respectively, at voltage levels (e.g., positive or negative) needed to complete the particular memory cell operation. As discussed above with regard to the structure 100 of FIG. 1 and illustrated in FIGS. 3 and 4, these voltages are operation-dependent. For example, for a forming operation, HV_VWL_Z (which will be applied by the zone-specific word line biasing circuit to the word line that is connected to the RRAM cell at issue) will be 2.5V and HV_VBL_Z (which will be applied by the zone-specific bit line biasing circuit to the bit line that is connected to the RRAM cell at issue) will be 4.0V, and so on. It should be noted that in all unselected zones (e.g., zones $501_1$-$501_y$ when zone $501_0$ is selected), the zone-specific power switch 560 contained therein can supply VDDW (e.g., at 1.8V) to both the zone-specific bit line biasing circuit 530 and the zone-specific word line biasing circuit 520. That is, HV_VBL_Z will be at VDDW and HV_VWL_Z will also be at VDDW. Since no write/read operations are to be performed in the unselected zones $501_1$-$501_y$, all source lines and all bit lines of the zone-specific arrays 510 contained therein can be connected to ground.

Structure 500 can further include a global sense circuit 540, which includes one or more sense amplifiers 541 and which is connected to zones $501_0$-$501_y$ to facilitate read operations.

Referring to the flow diagram of FIG. 6, also disclosed herein are operating methods associated with the above-described structures. For example, the method can include providing an RRAM architecture, such as structure 100 of FIG. 1 discussed in detail above or, alternatively, structure 500 of FIG. 5 (see process 602). For purposes of illustration, the method is described below with respect to structure 100. However, it should be understood that this description is not intended to be limiting and that, alternatively, the method could be performed using structure 500. The method can include biasing bit lines $181_0$-$181_y$ with bit line voltages, respectively; and concurrently biasing word lines $183_0$-$183_x$ with word line voltages, respectively. Such biasing can be performed for forming, reset, set, or read operations in any selected RRAM cell 101 with array 110. The specific bit line voltages employed are operation-dependent and bit line connection-dependent and are at any one of multiple possible positive bit line voltage levels, at a negative bit line voltage level, or at ground. The specific word line voltages employed are operation-dependent and word line connection-dependent and are at any one of multiple positive word line voltage levels, at a negative word line voltage level, or at ground.

As mentioned above, for purposes of this disclosure, "operation-dependent" refers to whether the operation being performed in a selected RRAM cell is a forming operation, a reset operation, a set operation, or a read operation. "Word line connection-dependent" refers to being dependent on whether the word line at issue is for a row containing the selected RRAM cell and, thus, is connected to the selected RRAM cell or whether the word line at issue is for a row not containing the selected RRAM cell and, thus, not connected to the selected RRAM cell. Similarly, "bit line connection-dependent" refers to being dependent on whether the bit line at issue is for a column containing the selected RRAM cell and, thus, connected to the selected RRAM cell or whether the bit line at issue is for a column that does not contain the selected RRAM cell and, thus, is not connected to the selected RRAM cell.

For example, a forming operation directed to a selected RRAM cell in a specific column and a specific row can be performed to change the programming state of programmable resistor 102 in the selected RRAM cell from an initial high resistance state (HRS), as shown in FIG. 2A, to a formed low resistance state (LRS), as shown in FIG. 2B (see process 604). At processing 604, bit line biasing can include biasing the specific BL for the specific column containing the selected RRAM cell with a high first positive bit line voltage (e.g., of approximately +4.0V) and connecting all other bit lines (i.e., BLs for columns not containing the selected RRAM) to ground (e.g., to 0.0V). Concurrent word line biasing can including biasing the specific WL for the specific row containing the selected RRAM with a first positive word line voltage (e.g., of approximately +2.5V), which is lower than the first positive bit line voltage, and connecting all other word lines (i.e., WLs for rows not containing the selected RRAM cell) to ground (e.g., to 0.0V). In this case, when access transistor 103 turns on in response to the first positive word line voltage, current flows through access transistor 103 from the BL to the SL, thereby creating conductive filament(s) 215.

Reset or set operations directed to the same selected RRAM cell can be performed subsequent to the forming operation (see processes 606 and 608).

Specifically, a reset operation directed to the same selected RRAM cell can be performed to reset the programming state of programmable resistor 102 at a HRS (e.g., to store a logic value of "0") as shown in FIG. 2C (see process 606). At process 606, bit line biasing can include biasing the specific BL for the specific column containing the selected RRAM cell with a negative bit line voltage (e.g., of approximately −1.6V) and connecting all other bit lines (i.e., BLs for columns not containing the selected RRAM) to ground (e.g., to 0.0V). Concurrent word line biasing can include biasing the specific WL for the specific row containing the selected RRAM with a second positive word line voltage (e.g., of approximately +1.8V), which is lower than the first positive word line voltage, and can connect all other word lines (i.e., WLs for rows not containing the selected RRAM cell) to a negative word line voltage (e.g., of approximately −1.8V), which is lower than the negative bit line voltage to prevent access transistor in non-selected RRAM cells from turning on. In this case, when access transistor 103 turns on in response to the second positive word line voltage, current flows through access transistor 103 from the SL (at 0.0V) to the BL (at −1.6V), thereby breaking up/reducing conductive filament(s) 215.

A set operation directed to the same selected RRAM cell can be performed to set the programming state of programmable resistor 102 at a LRS (e.g., to store a logic value of "1"), as shown in FIG. 2D (see process 608). At process 608, bit line biasing can include biasing the specific BL for the specific column containing the selected RRAM cell with a second positive bit line voltage (e.g., of approximately +2.5V), which is lower than the first positive bit line voltage (e.g., of +4.0V) used for the forming operation, and connecting all other bit lines (i.e., BLs for columns not containing the selected RRAM) to ground (e.g., to 0.0V). Concurrent word line biasing can include biasing the specific WL for the specific row containing the selected RRAM with the first positive word line voltage (e.g., of approximately +2.5V) (i.e., the same positive word line voltage that was used during forming) and connecting all other word lines (i.e., WLs for rows not containing the selected RRAM cell) to ground (e.g., to 0.0V). In this case, when access transistor 103 turns on in response to the first positive word line voltage, current again flows through access transistor 103 from the BL to the SL, thereby reforming/repairing conductive filament(s) 215.

A read operation directed to the same selected RRAM cell can also be performed at any time to determine the logic value stored therein (see process 610). At process 610, bit line biasing can include biasing the specific BL for the specific column containing the selected RRAM cell with a third positive bit line voltage (referred to herein as VREAD, for example, at +150 mV) and connecting all other bit lines (i.e., BLs for columns not containing the selected RRAM cell) to ground (e.g., 0.0V). Concurrent word line biasing can include biasing the specific WL for the specific row containing the selected RRAM with a third positive word line voltage (referred to herein as +VDDW, for example, at +1.8V) and connecting all other word lines (i.e., WLs for rows not containing the selected RRAM cell) to ground (e.g., 0.0V). As discussed above with regard to structure 100, during such a read operation, changes in an electrical parameter (e.g., voltage or current) on the specific BL connected to the selected RRAM cell can be sensed and, based thereon, a data output value indicative of the logic value "1" or "0" stored in the selected RRAM cell can be output.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated)

and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
source lines connected to ground;
bit lines;
an array of resistive random access memory (RRAM) cells arranged in columns and rows, wherein all RRAM cells in a column are connected between a source line and a bit line for the column;
a bit line biasing circuit connected to the bit lines;
an analog block connected to the bit line biasing circuit, wherein the analog block is configured to output, to the bit line biasing circuit, a first supply voltage selectable from a range of negative to positive supply voltages;
word lines, wherein all RRAM cells in a row are connected to a word line for the row; and
a word line biasing circuit connected to the word lines, wherein the analog block is further connected to the word line biasing circuit and configured to output, to the word line biasing circuit, a second supply voltage selectable from the range of negative to positive supply voltages, wherein the bit line biasing circuit is configured to apply bit line voltages to the bit lines, respectively, using the first supply voltage, wherein each of the bit line voltages is operation-dependent and bit line connection-dependent, wherein the word line biasing circuit is configured to apply word line voltages to the word lines, respectively, using the second supply voltage, and wherein each of the word line voltages is operation-dependent and word line connection-dependent.

2. The structure of claim 1, wherein, for a forming operation of a selected RRAM cell connected to a specific bit line for a specific column and a specific word line for a specific row, the bit line biasing circuit biases the specific bit line with a positive bit line voltage and connects all other bit lines to ground, and wherein, for the forming operation, the word line biasing circuit biases the specific word line with a positive word line voltage lower than the positive bit line voltage and connects all other word lines to ground.

3. The structure of claim 1, wherein, for a reset operation of a selected RRAM cell connected to a specific bit line for a specific column and a specific word line for a specific row, the bit line biasing circuit biases the specific bit line with a negative bit line voltage and connects all other bit lines to ground, and wherein, for the reset operation, the word line biasing circuit biases the specific word line with a positive word line voltage and biases all other word lines with a negative word line voltage.

4. The structure of claim 1, wherein, for a set operation of a selected RRAM cell connected to a specific bit line for a specific column and a specific word line for a specific row, the bit line biasing circuit biases the specific bit line with a positive bit line voltage and connects all other bit lines to ground, and wherein, for the set operation, the word line biasing circuit biases the specific word line with a positive word line voltage equal to the positive bit line voltage and connects all other word lines to ground.

5. The structure of claim 1, wherein, for a read operation of a selected RRAM cell connected to a specific bit line for a specific column and a specific word line for a specific row, the bit line biasing circuit biases the specific bit line with a positive bit line voltage and connects all other bit lines to ground, and wherein, for the read operation, the word line biasing circuit biases the specific word line with a positive word line voltage higher than the positive bit line voltage and connects all other word lines to ground.

6. The structure of claim 1, wherein the bit line biasing circuit includes:

a bit line multiplexor connected to the bit lines;

a column decode block connected to the bit line multiplexor; and an anode driver connected to the bit line multiplexor, wherein the analog block includes at least one positive/negative charge pump.

7. A structure comprising:

multiple zones, wherein each zone includes:

source lines connected to ground;

bit lines;

word lines;

a zone-specific array of resistive random access memory (RRAM) cells arranged in columns and rows, wherein all RRAM cells in a column are connected between a source line and a bit line for the column and wherein all RRAM cells in a row are connected to a word line for the row;

a zone-specific bit line biasing circuit connected to the bit lines, wherein the zone-specific bit line biasing circuit biases the bit lines with bit line voltages, respectively;

a zone-specific word line biasing circuit connected to the word lines, wherein the zone-specific word line biasing circuit biases the word lines with word line voltages, respectively;

a zone-specific power switch connected to the zone-specific bit line biasing circuit and to the zone-specific word line biasing circuit; and an analog block connected to the multiple zones, wherein the analog block is configured to output, to the zone-specific power switch in each zone, a first supply voltage selectable from a range of negative to positive supply voltages and a second supply voltage selectable from the range.

8. The structure of claim 7, wherein, within a selected zone, the zone-specific power switch supplies the zone-specific bit line with the first supply voltage and the zone-specific bit line biasing circuit applies bit line voltages to the bit lines, respectively, using the first supply voltage, wherein each of the bit line voltages is operation-dependent and bit line connection-dependent, wherein, within the selected zone, the zone-specific power switch supplies the zone-specific word line biasing circuit with the second supply voltage and the zone-specific word line biasing circuit applies word line voltages to the word lines, respectively, using the second supply voltage, and wherein each of the word line voltages is operation-dependent and word line connection-dependent.

9. The structure of claim 8, wherein, for a forming operation of a selected RRAM cell connected to a specific bit line for a specific column and a specific word line for a specific row in the zone-specific array of a selected zone, the zone-specific bit line biasing circuit biases the specific bit line with a positive bit line voltage and connects all other bit lines to ground, and wherein, for the forming operation, the zone-specific word line biasing circuit biases the specific word line with a positive word line voltage lower than the positive bit line voltage and connects all other word lines to ground.

10. The structure of claim 8, wherein, for a reset operation of a selected RRAM cell connected to a specific bit line for a specific column and a specific word line for a specific row in the zone-specific array of a selected zone, the zone-specific bit line biasing circuit biases the specific bit line with a negative bit line voltage and connects all other bit lines to ground, and wherein, for the reset operation, the zone-specific word line biasing circuit biases the specific word line with a positive word line voltage and biases all other word lines with a negative word line voltage.

11. The structure of claim 8, wherein, for a set operation of a selected RRAM cell connected to a specific bit line for a specific column and a specific word line for a specific row in the zone-specific array of a selected zone, the zone-specific bit line biasing circuit biases the specific bit line with a positive bit line voltage and connects all other bit lines to ground, and wherein, for the set operation, the zone-specific word line biasing circuit biases the specific word line with a positive word line voltage equal to the positive bit line voltage and connects all other word lines to ground.

12. The structure of claim 8, wherein, for a read operation of a selected RRAM cell connected to a specific bit line for a specific column and a specific word line for a specific row in the zone-specific array of a selected zone, the zone-specific bit line biasing circuit biases the specific bit line with a positive bit line voltage and connects all other bit lines to ground, and wherein, for the read operation, the zone-specific word line biasing circuit biases the specific word line with a positive word line voltage higher than the positive bit line voltage and connects all other word lines to ground.

13. The structure of claim 7, wherein the zone-specific bit line biasing circuit includes:

a bit line multiplexor connected to the bit lines;

a column decode block connected to the bit line multiplexor; and an anode driver connected to the bit line multiplexor, and wherein the analog block includes at least one positive/negative charge pump.

14. A method comprising:

biasing bit lines of a structure with bit line voltages, respectively; and concurrently biasing word lines of the structure with word line voltages, respectively, wherein the structure includes: source lines connected to ground; the bit lines; the word lines; and an array of resistive random access memory (RRAM) cells arranged in columns and rows, wherein all RRAM cells in a column are connected between a source line and a bit line for the column and wherein all RRAM cells in a row are connected to a word line for the row, wherein each of the bit line voltages is operation-dependent, is bit line connection-dependent, and is at any one of multiple positive bit line voltage levels, a negative bit line voltage level, and ground, and wherein each of the word line voltages is operation-dependent, is word line connection-dependent, and is at any one of multiple positive word line voltage levels, a negative word line voltage level, and ground.

15. The method of claim 14, wherein, for a forming operation of a selected RRAM cell connected to a specific bit line for a specific column and a specific word line for a specific row, the biasing of the bit lines includes biasing the specific bit line with a positive bit line voltage and connecting all other bit lines to ground, and wherein, for the forming operation, the biasing of the word lines includes biasing the specific word line with a positive word line voltage lower than the positive bit line voltage and connecting all other word lines to ground.

16. The method of claim 14, wherein, for a reset operation of a selected RRAM cell connected to a specific bit line for a specific column and a specific word line for a specific row, the biasing of the bit lines includes biasing the specific bit line with a negative bit line voltage and connecting all other bit lines to ground, and wherein, for the reset operation, the biasing of the word lines includes biasing the specific word line with a positive word line voltage and biasing all other word lines with a negative word line voltage.

17. The method of claim 14, wherein, for a set operation of a selected RRAM cell connected to a specific bit line for a specific column and a specific word line for a specific row, the biasing of the bit lines includes biasing the specific bit line with a positive bit line voltage and connecting all other bit lines to ground, and wherein, for the set operation, the biasing of the word lines includes biasing the specific word line with a positive word line voltage equal to the positive bit line voltage and connecting all other word lines to ground.

18. The method of claim 14, wherein, for a read operation of a selected RRAM cell connected to a specific bit line for a specific column and a specific word line for a specific row, the biasing of the bit lines includes biasing the specific bit line with a positive bit line voltage and connecting all other bit lines to ground, and wherein, for the read operation, the biasing of the word lines includes biasing the specific word line with a positive word line voltage higher than the positive bit line voltage and connecting all other word lines to ground.

* * * * *